(12) United States Patent
Toishi et al.

(10) Patent No.: US 7,129,014 B2
(45) Date of Patent: Oct. 31, 2006

(54) POSITIVE RESIST COMPOSITION

(75) Inventors: Kouji Toishi, Hannan (JP); Yoshiko Miya, Kyoto (JP); Yasunori Uetani, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/404,671

(22) Filed: Apr. 2, 2003

(65) Prior Publication Data

US 2003/0236351 A1    Dec. 25, 2003

(30) Foreign Application Priority Data

Apr. 3, 2002    (JP)    ............................ 2002-101003

(51) Int. Cl.
    *G03C 1/71*    (2006.01)
(52) U.S. Cl. .................. 430/270.1; 430/907; 526/242; 526/281; 524/544
(58) Field of Classification Search ............. 430/270.1, 430/907; 526/242, 281; 524/544
See application file for complete search history.

(56) References Cited

U.S. PATENT DOCUMENTS

| | | | |
|---|---|---|---|
| 4,897,457 A | 1/1990 | Nakamura et al. | 526/247 |
| 4,910,276 A | 3/1990 | Nakamura et al. | 526/247 |
| 5,910,392 A * | 6/1999 | Nozaki et al. | 430/270.1 |
| 6,352,813 B1 * | 3/2002 | Nakano et al. | 430/280.1 |
| 6,465,148 B1 * | 10/2002 | Kang et al. | 430/270.1 |
| 6,479,211 B1 * | 11/2002 | Sato et al. | 430/270.1 |
| 6,593,058 B1 * | 7/2003 | Feiring et al. | 430/270.1 |
| 6,720,129 B1 * | 4/2004 | Lee et al. | 430/270.1 |
| 6,770,417 B1 * | 8/2004 | Nozaki et al. | 430/270.1 |
| 2003/0113663 A1 * | 6/2003 | Kobayshi | 430/270.1 |
| 2003/0148210 A1 * | 8/2003 | Funaki et al. | 430/270.1 |
| 2003/0194639 A1 * | 10/2003 | Miya et al. | 430/270.1 |

* cited by examiner

*Primary Examiner*—David W. Wu
*Assistant Examiner*—Henry Hu
(74) *Attorney, Agent, or Firm*—Birch, Stewart, Kolasch & Birch, LLP

(57) ABSTRACT

The present invention provides a positive resist composition comprising a resin which itself is insoluble or poorly soluble in an alkali aqueous solution but becomes soluble in an alkali aqueous solution by the action of an acid, an acid generator, and multifunctional epoxy compound, wherein the content of halogen atoms in the resin is 40% by weight or more, at least one of structural units constituting the resin is a structural unit having an alicyclic hydrocarbon skeleton, and the structural unit having an alicyclic hydrocarbon skeleton contains therein at least one group rendering the resin soluble in an alkali aqueous solution by the action of an acid, and at least one halogen atom.

26 Claims, No Drawings

POSITIVE RESIST COMPOSITION

BACKGROUND OF THE INVENTION

1. Field of the Invention

The present invention relates to a chemical amplification type positive resist composition.

2. Prior Art

For fine processing of semiconductors, a lithography process using a resist composition is usually adopted, and in lithography, it is theoretically possible to increase resolution higher when exposure wavelength is shorter as represented by the Rayleigh diffraction limitation formula. As the exposure light source for lithography used for production of semiconductors, there are g ray having a wavelength of 436 nm, i ray having a wavelength of 365 nm, KrF excimer laser having a wavelength of 248 nm and ArF excimer laser having a wavelength of 193 nm, developed in this order, the wavelength becoming shorter year by year. Further, as the exposure light source of the next generation, $F_2$ excimer laser having a wavelength of 157 nm is promising. For exposure to KrF excimer laser and ArF excimer laser, what is called chemical amplification type resists utilizing the catalytic action of an acid generated by exposure are often used due to excellent sensitivity. Further, also for exposure to $F_2$ excimer laser, there is a high possibility of use of chemical amplification type resists due to excellent sensitivity.

However, resins used in resists for KrF excimer laser exposure and ArF excimer laser exposure do not show sufficient performance for lights of wavelengths of 170 nm or less, for example, $F_2$ excimer laser having a wavelength of 157 nm.

An object of the present invention is to provide a resist composition which is suitable for $F_2$ excimer laser lithography, and which show excellent in various resist properties such as sensitivity, resolution and the like, and especially excellent in durability against dry etching.

The present inventors have found that a resist composition showing improved durability against dry etching as well as excellent in properties such as sensitivity, resolution and the like can be produced by using a resin, which contains a structural unit having a specific skeleton, and a polyfunctional epoxy compound.

SUMMARY OF THE INVENTION

The present invention relates to the followings.

<1> A positive resist composition comprising a resin which itself is insoluble or poorly soluble in an alkali aqueous solution but becomes soluble in an alkali aqueous solution by the action of an acid, an acid generator, and a multifunctional epoxy compound, wherein the content of halogen atoms in the resin is 40% by weight or more, at least one of structural units constituting the resin is a structural unit having an alicyclic hydrocarbon skeleton, and the structural unit having an alicyclic hydrocarbon skeleton contains therein at least one group rendering the resin soluble in an alkali aqueous solution by the action of an acid, and at least one halogen atom.

<2> The positive resist composition according to <1> wherein the alicyclic hydrocarbon skeleton is a skeleton of the following formula (1):

wherein $R_2$ and $R_3$ bond to form an alicyclic hydrocarbon ring together with adjacent carbon atom, the alicyclic hydrocarbon ring formed by $R_2$, $R_3$ and the carbon atom bonds to at least one group containing a group rendering a resin soluble in an alkali aqueous solution by the action of an acid, and bonds to at least one halogen atom; $R_1$ represents a hydrogen atom, halogen atom or aliphatic hydrocarbon group.

<3> The positive resist composition according to <2> wherein the cyclic hydrocarbon skeleton of the formula (1) is an alicyclic hydrocarbon skeleton of the formula (2):

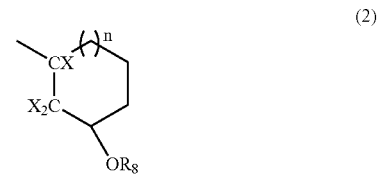

wherein X represents a halogen atom, $R_8$ represents a hydrogen or an acid-unstable group dissociating in the presence of an acid, and n represents 0 or 1.

<4> The positive resist composition according to <3> wherein the alicyclic hydrocarbon skeleton of the formula (2) is an alicyclic hydrocarbon skeleton containing a partial structure of the formula (3):

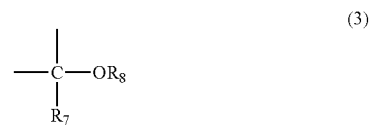

wherein C is a carbon atom forming an alicyclic hydrocarbon skeleton; $R_7$ represents an alkyl group having 1 to 6 carbon atoms substituted with at least one halogen atom or alicyclic hydrocarbon group substituted with at least one halogen atom; and $R_8$ has the same meaning as described above.

<5> The positive resist composition according to <4> wherein the cyclic hydrocarbon skeleton of the formula (2) is an alicyclic hydrocarbon skeleton of the formula (4):

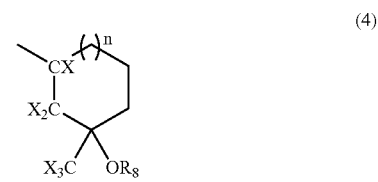

wherein X, $R_8$ and n have the same meanings as described above.

<6> The positive resist composition according to any one of <3> to <5> wherein $R_8$ is a group of the formula (5):

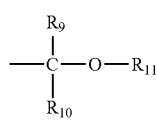
(5)

wherein $R_9$ and $R_{10}$ each independently represent an alkyl group having 1 to 14 carbon atoms or a hydrogen atom, the alkyl group may have at least one group selected from the group consisting of halogen atoms and alicyclic hydrocarbon groups; $R_{11}$ represents an alkyl group having 1 to 14 carbon atoms, alicyclic hydrocarbon group, lactone ring group or aromatic hydrocarbon group, the alkyl group may have at least one substituent selected from the group consisting of halogen atom, alicyclic hydrocarbon group and aromatic hydrocarbon group, the alicyclic hydrocarbon group, lactone ring group and aromatic hydrocarbon group in $R_{11}$ may each independently have at least one substituent selected from the group consisting of halogen atoms and alkyl groups.

<7> The positive resist composition according to <6> wherein in the formula (5), $R_9$ and $R_{10}$ represent a hydrogen atom, and $R_{11}$ represents an ethyl group.

<8> The positive resist composition according to <2>, <6> or <7> wherein the cyclic hydrocarbon skeleton of the formula (1) is a skeleton of the formula (6):

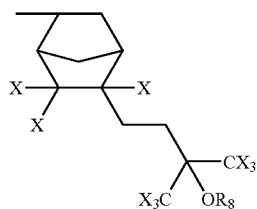
(6)

wherein X and $R_8$ have the same meanings as described above.

<9> The positive resist composition according to any one of <1> to <8> wherein the halogen atom is a fluorine atom.

<10> The positive resist composition according to <1>, <5>, <6> or <7> wherein the structural unit having an alicyclic hydrocarbon skeleton is a structural unit of the formula (7):

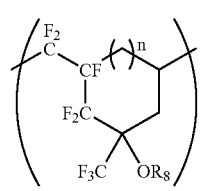
(7)

wherein n and $R_8$ have the same meanings as described above.

<11> The positive resist composition according to <1>, <6>, <7> or <8> wherein the structural unit having an alicyclic hydrocarbon skeleton is a structural unit of the formula (10):

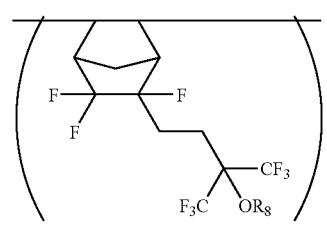
(10)

wherein $R_8$ has the same meaning as described above.

<12> The positive resist composition according to <1>, <5>, <6>, <7> or <10> wherein the resin is a copolymer containing a structural unit of the following formula (8) and a structural unit of the following formula (8-1):

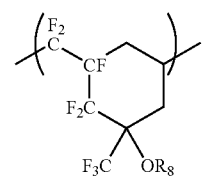
(8)

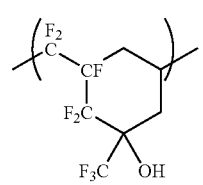
(8-1)

wherein $R_8$ has the same meaning as described above.

<13> The positive resist composition according to <1>, <5>, <6>, <7> or <10> wherein the resin is a copolymer containing a structural unit of the following formula (9) and a structural unit of the following formula (9-1):

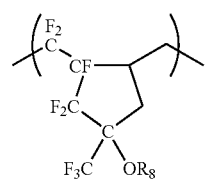
(9)

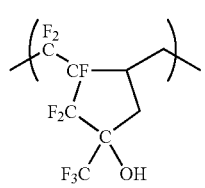
(9-1)

wherein, $R_8$ has the same meaning as described above.

<14> The positive resist composition according to <1>, <6>, <7>, <8> or <11> wherein the resin is a copolymer containing a structural unit of the following formula (10) and a structural unit of the following formula (10-1):

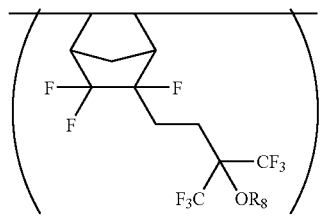
(10)

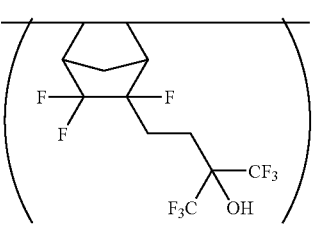
(10-1)

wherein, $R_8$ has the same meaning as described above.

15. The positive resist composition according to <1>, <8> or <11> wherein the resin is a copolymer containing a structural unit of the following formula (11), a structural unit of the following formula (12) and a structural unit of the following formula (12-1):

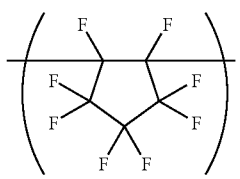
(11)

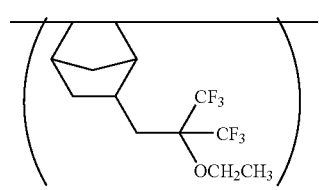
(12)

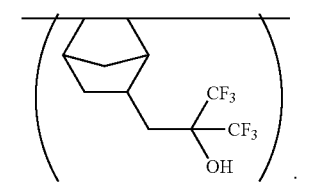
(12-1)

<16> The positive resist composition according to any one of <1> to <15> wherein the multifunctional epoxy compound is a compound of the following formula (13-1):

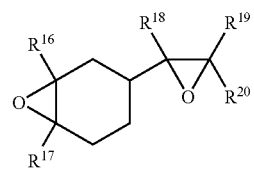
(13-1)

wherein $R^{16}$, $R^{17}$, $R^{18}$, $R^{19}$ and $R^{20}$ each independently represents hydrogen atom, methyl or ethyl.

<17> The positive resist composition according to any one of <1> to <15> wherein the multifunctional epoxy compound is a compound of the following formula (13-2):

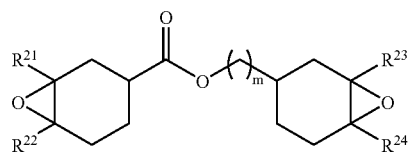
(13-2)

wherein $R^{21}$, $R^{22}$, $R^{23}$ and $R^{24}$ each independently represents hydrogen atom, methyl or ethyl; and m represents an integer of 1 to 8.

<18> The positive resist composition according to any one of <1> to <15> wherein the multifunctional epoxy compound is a compound of the following formula (13-3):

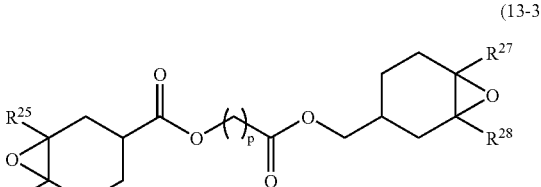
(13-3)

wherein $R^{25}$, $R^{26}$, $R^{27}$ and $R^{28}$ each independently represents hydrogen atom, methyl or ethyl; and p represents an integer of 1 to 8.

<19> The positive resist composition according to <1> wherein the multifunctional epoxy compound is a compound of the following formula (13-11):

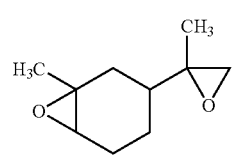
(13-11)

<20> The positive resist composition according to any one of <1> to <19> wherein the content of the structural unit having an alicyclic hydrocarbon skeleton and containing therein at least one group rendering the resin soluble in an alkali aqueous solution by the action of an acid, and at least one halogen atom is 15 to 50 mol % in the resin.

<21> The positive resist composition according to any one of <1> to <20> wherein the composition comprises an acid generator of the general formula (14):

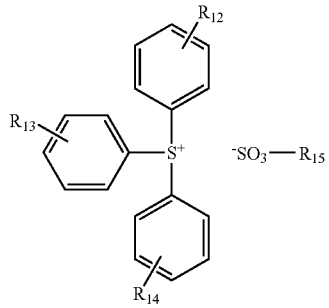

(14)

wherein $R_{12}$, $R_{13}$ and $R_{14}$ represent each independently a hydrogen atom, halogen atom, hydroxyl group, alkyl group having 1 to 14 carbon atoms or alkoxy group having 1 to 14 carbon atoms, wherein the alkyl group may have at least one substituent selected from the group consisting of halogen atoms, hydroxyl group, alicyclic hydrocarbon groups, lactone group and aromatic hydrocarbon groups, and the alicyclic hydrocarbon group, lactone group and aromatic hydrocarbon group may each independently have at least one substituent selected from the group consisting of halogen atoms, hydroxyl group and alkyl groups, the alkoxy group may have at least one substituent selected from the group consisting of halogen atoms, hydroxyl group, alicyclic hydrocarbon groups and aromatic hydrocarbon groups, the alicyclic hydrocarbon group and aromatic hydrocarbon group may each independently have at least one substituent selected from the group consisting of halogen atoms, hydroxyl group and alkyl groups; and $R_{15}$ represents straight chained or branched alkyl group optionally substituted with a halogen atom or alicyclic alkyl group optionally substituted with a halogen atom.

<22> The positive resist composition according to any one of <1> to <20> wherein the composition further comprises an acid generator of the general formula (15):

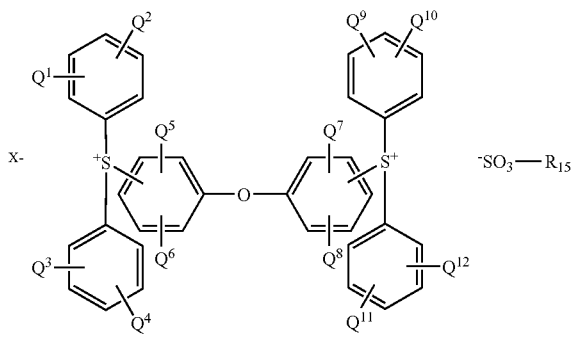

(15)

wherein $Q_1$ to $Q_{12}$ each independently represents hydrogen atom, hydroxyl group, straight chained or branched alkyl group having 1 to 6 carbon atoms or straight chained or branched alkoxy group having 1 to 6 carbon atoms; and $R_{15}$ has the same meaning as described above.

<23> The positive resist composition according to any one of <1> to <20> wherein the composition further comprises an acid generator of the general formula (16):

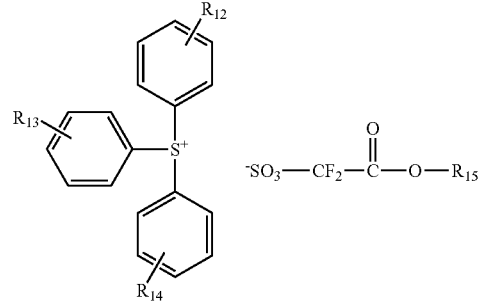

(16)

wherein $R_{12}$, $R_{13}$, $R_{14}$ and $R_{15}$ have the same meanings as defined above.

<24> The positive resist composition according to any one of <21> to <23> wherein $R_{15}$ is a methyl group.

<25> The positive resist composition according to any one of <21> to <23> wherein $R_{15}$ is a trifluoromethyl group.

<26> The positive resist composition according to any one of <1> to <25> wherein the content of the acid generator is 0.1 to 20 parts by weight, and the content of the multi-functional epoxy compound is 0.01 to 5 parts by weight per 100 parts by weight of the resin which itself is insoluble or poorly soluble in an alkali aqueous solution but becomes soluble in an alkali aqueous solution by the action of an acid.

<27> The positive resist composition according to any one of <1> to <26> wherein the composition further comprises a basic compound.

<28> The positive resist composition according to <27> wherein the content of the basic compound is 0.001 to 1 part by weight per 100 parts by weight of the resin which itself is insoluble or poorly soluble in an alkali aqueous solution but becomes soluble in an alkali aqueous solution by the action of an acid.

<29> The positive resist composition according to <27> or <28> wherein the basic compound is a compound of the following formula (17):

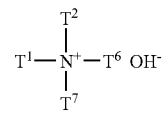

(17)

wherein $T^1$, $T^2$ and $T^7$ each independently represent alkyl, cycloalkyl or aryl. The alkyl preferably has about 1 to 6 carbon atoms, the cycloalkyl preferably has about 5 to 10 carbon atoms, and the aryl preferably has about 6 to 10 carbon atoms, at least one hydrogen on the alkyl, cycloalkyl or aryl may each independently be substituted with a hydroxyl group, an amino group, or an alkoxy group having 1 to 6 carbon atoms, and at least one hydrogen on the amino group each independently may be substituted with an alkyl group having 1 to 4 carbon atoms; $T^6$ represents alkyl or cycloalkyl, at least one hydrogen on the alkyl or cycloalkyl may each independently be substituted with a hydroxyl group, an amino group, or an alkoxy group having 1 to 6 carbon atoms, and at least one hydrogen on the amino group may be substituted with an alkyl group having 1 to 4 carbon atoms.

DETAILED DESCRIPTION OF PREFERRED EMBODIMENTS

The present resist composition comprises a resin which itself is insoluble or poorly soluble in an alkali aqueous solution but becomes soluble in an alkali aqueous solution by the action of an acid an acid generator, and a multifunctional epoxy compound.

In the present resist composition, the content of halogen atoms in the resin is 40% by weight or more, at least one of structural units constituting the resin is a structural unit having an alicyclic hydrocarbon skeleton, and the structural unit having an alicyclic hydrocarbon skeleton contains therein at least one group rendering the resin soluble; in an alkali aqueous solution by the action of an acid, and the structural unit having an alicyclic hydrocarbon skeleton contains therein at least one halogen atom.

In the present invention, the term skeleton means a basic frame of a molecule or a group and represents a frame symbolized by removing hydrogen atoms and/or possible substituents from the structural formula with exception of the part(s) particularly manifested explicitly. Therefore, when hydrogen atom(s) or substituent(s) is(are) specified particularly in a skeleton, other unspecified parts indicate a frame. The alicyclic hydrocarbon skeleton includes a cycloalkane skeleton and the like. The term alicyclic hydrocarbon ring used in the present invention has the same, but more specific meaning as for the term alicyclic hydrocarbon skeleton (sometimes used for avoiding confusion).

As the alicyclic hydrocarbon skeleton, skeletons of the following formula (1) can be listed.

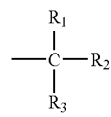
(1)

wherein $R_2$ and $R_3$ bond to form an alicyclic hydrocarbon ring together with adjacent C (carbon atom), the alicyclic hydrocarbon ring formed by $R_2$, $R_3$ and C bonds to at least one group containing a group rendering a resin soluble in an alkali aqueous solution by the action of an acid, and bonds to at least one halogen atom; $R_1$ represents a hydrogen atom, halogen atom or aliphatic hydrocarbon group.

As the alicyclic hydrocarbon ring formed by $R_2$, $R_3$ and C, a cyclopentane ring, cyclohexane ring and the like can be listed. As the halogen atom, a fluorine atom is preferable. As the group containing a group rendering a resin soluble in an alkali aqueous solution by the action of an acid, —$OR_8$ group described later, alkoxyalkyl group optionally substituted with at least one halogen atom, alkoxyalkoxyalkyl group optionally substituted with at least one halogen atom, and the like can be listed.

Specific examples of the alicyclic hydrocarbon skeleton of the formula (1), listed are alicyclic hydrocarbon skeletons of the (2):

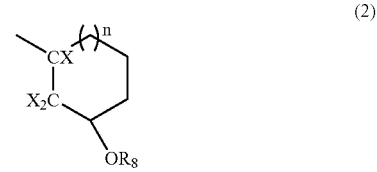
(2)

wherein X represents a halogen atom, $R_8$ represents a hydrogen atom or an acid-unstable group dissociating in the presence of an acid, and n represents 0 or 1;

alicyclic hydrocarbon skeletons of the (6):

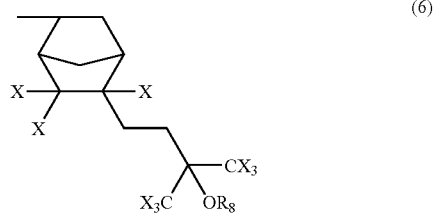
(6)

wherein X and $R_8$ have the same meanings as described above; and the like.

Further, other example of the alicyclic hydrocarbon skeleton is a skeleton containing a partial structure of the following formula (3):

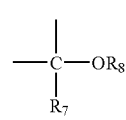
(3)

wherein C is a carbon atom forming an alicyclic hydrocarbon skeleton; $R_7$ represents an alkyl group having 1 to 6 carbon atoms substituted with at least one halogen atom or alicyclic hydrocarbon group substituted with at least one halogen atom; and $R_8$ has the same meaning as described above.

Examples of the alkyl group having 1 to 6 carbon atoms substituted with at least one halogen atom are fluoromethyl group, difluoromethyl group, trifluoromethyl group, 2,2,2-trifluoroethyl group, perfluoroethyl group, —$C(CF_3)_3$ group, and the like. This alkyl group may be straight chained or branched.

Examples of the alicyclic hydrocarbon group substituted with at least one halogen atom are perfluorocyclopentyl group, perfluorocyclohexyl group, and the like.

Specific examples of the skeleton containing a partial structure of the formula (3) as the alicyclic hydrocarbon skeleton, are alicyclic hydrocarbon skeleton of the formula (4):

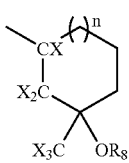

(4)

wherein X, $R_8$ and n have the same meanings as described above, and the like.

Examples of $R_8$ are a group of the formula (5):

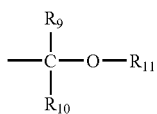

(5)

wherein $R_9$ and $R_{10}$ each independently represent an alkyl group having 1 to 14 carbon atoms or a hydrogen atom, the alkyl group may have at least one group selected from the group consisting of halogen atoms and alicyclic hydrocarbon groups; $R_{11}$ represents an alkyl group having 1 to 14 carbon atoms, alicyclic hydrocarbon group, lactone ring group or aromatic hydrocarbon group, the alkyl group may have at least one substituent selected from the group consisting of halogen atom, alicyclic hydrocarbon group and aromatic hydrocarbon group, the alicyclic hydrocarbon group, lactone ring group and aromatic hydrocarbon group in $R_{11}$ may each independently have at least one substituent selected from the group consisting of halogen atoms and alkyl groups.

Specific examples of $R^8$ include acetal type group such as 1-ethoxyethyl group, 1-(2-methylpropoxy)ethyl group, 1-(2-methoxyethoxy)ethyl group, 1-(2-acetoxyethoxy)ethyl group, 1-[2-(1-adamantyloxy)ethoxy]ethyl group, 1-[2-(1-adamantanecarbonyloxy)ethoxy]ethyl group, adamantyloxymethyl group, bicyclohexyloxymethyl group, adamantylmethoxymethyl group, methoxymethyl group, ethoxymethyl group, pivaloyloxymethyl group, methoxyethoxymethyl group, benzyloxymethyl group, bis(trifluoromethyl)methoxymethyl group, and the like.

Particularly because of easy availability and easy synthesis, methoxymethyl group and ethoxymethyl group are preferably used.

The acid-unstable group dissociating in the presence of an acid is substituted with a hydrogen atom to become an alkali soluble group by the action of an acid.

The acid-unstable group dissociating in the presence of an acid ($R_8$) can be easily introduced into a resin by performing a known protective group introducing reaction or conducting polymerization using as one monomer an unsaturated compound having such a group.

In the above-mentioned formula (3), it is preferable that $R_7$ is trifluoromethyl group since the transmittance of vacuum ultraviolet ray typified by 157 nm of resin composition increases.

Examples of the group having an alicyclic hydrocarbon skeleton of the formula (1), for example are alicyclic hydrocarbon groups in which carbon atoms forming the skeleton bond to hydrogen atoms, excepting portions bonded to a halogen atom or a group containing a group rendering a resin soluble in an alkali aqueous solution by the action of an acid; and alicyclic hydrocarbon groups in which at least one hydrogen atom bonding to a carbon atom is substituted with a (halo)alkyl group.

Examples of the structural unit having an alicyclic hydrocarbon skeleton of the formula (1), are structural units of the following formulae (8), (9), (10) and the like.

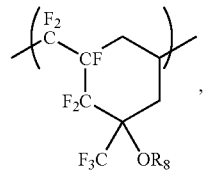

(8)

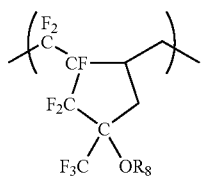

(9)

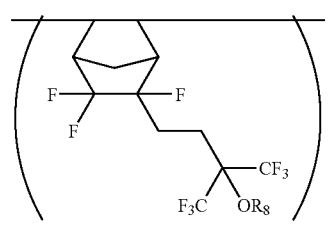

(10)

The resin used in the present invention can be obtained by polymerization according to a known polymerization reaction. Namely, a monomer capable of inducing the above-mentioned structural unit, and an initiator can be mixed and stirred at suitable temperature, in the presence or absence of a solvent, to effect the polymerization. A catalyst may be mixed, if necessary. The resulted polymer can be precipitated in a suitable solvent, for purification.

The resin in the present resist composition may be a resin substantially consisting of a structural unit having an alicyclic hydrocarbon skeleton and containing therein at least one group rendering the resin soluble in an alkali aqueous solution by the action of an acid, and at least one halogen atom. However, usually used are copolymers of the above-mentioned structural unit with the same structural unit as the above-mentioned structural unit excepting that a group rendering the resin soluble in an alkali aqueous solution by the action of an acid is not contained, namely, a group rendering the resin soluble in an alkali aqueous solution even without the action of an acid is contained. Specific example thereof is structural units of the above-mentioned formulas (8), (9) and (10) in which —$OR_8$ group is substituted by OH group.

Specifically listed are a copolymer composed of a structural unit of the formula:

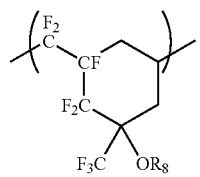

and a structural unit of the formula:

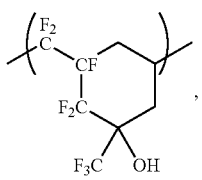

a copolymer composed of a structural unit of the formula:

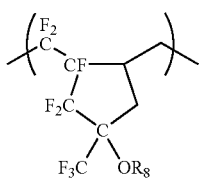

and a structural unit of the formula:

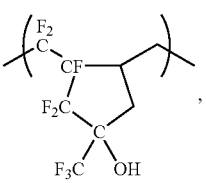

a copolymer composed of a structural unit of the formula:

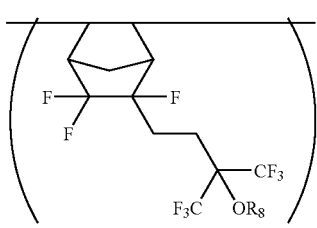

and a structural unit of the formula:

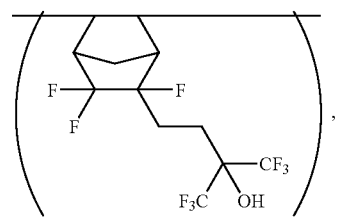

mixtures of these copolymers, and the like.

More specific examples thereof include a copolymer composed of a structural unit of the formula:

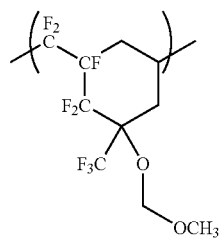

and a structural unit of the formula:

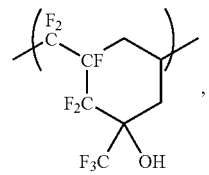

a copolymer composed of a structural unit of the formula:

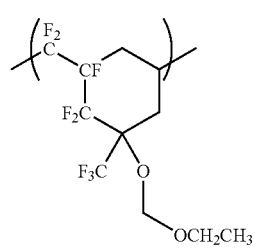

and a structural unit of the formula;

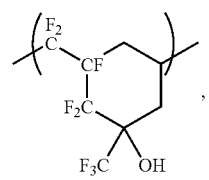

a copolymer composed of a structural unit of the formula:

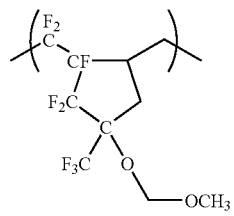

and a structural unit of the formula:

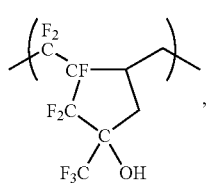, a copolymer composed of a structural unit of the formula:

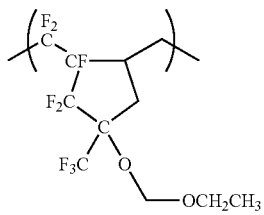

and a structural unit of the formula:

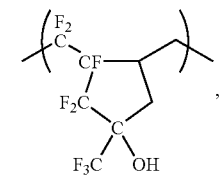, a copolymer composed of a structural unit of the formula:

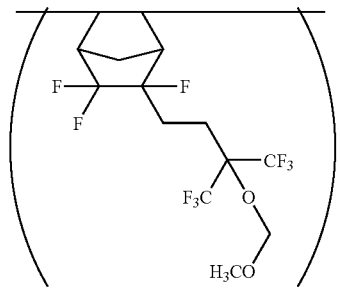

and a structural unit of the formula:

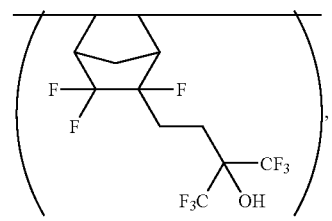, a copolymer composed of a structural unit of the formula:

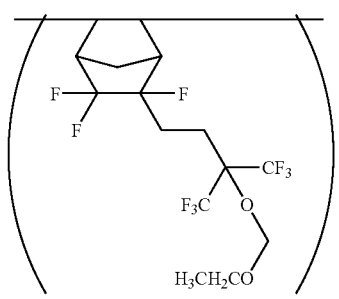

and a structural unit of the formula:

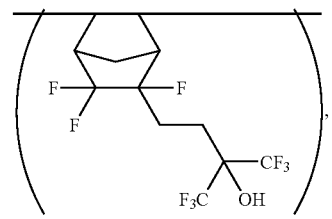, mixtures of these copolymers, and the like.

Besides, a copolymer composed of structural units of the formulae:

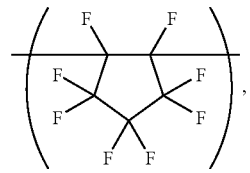

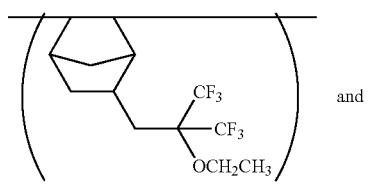 and

-continued

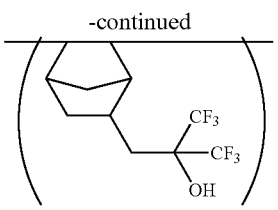

are also listed.

The resin use in the present invention contains halogen atoms in an amount of 40% by weight or more in the resin. Though varying depending on the kind of radiation for patterning exposure, the kind of a group dissociating by the action of an acid, and the like, it is generally preferable to contain 15 to 50 mol % of a structural unit having an alicyclic hydrocarbon skeleton and containing therein at least one group rendering the resin soluble in an alkali aqueous solution by the action of an acid, and at least one halogen atom in the resin.

The present resist composition also contains the multifunctional epoxy compound. The content of the multifunctional epoxy compound is usually 0.01 to 5 parts by weight per 100 parts by weight of the resin which itself is insoluble or poorly soluble in an alkali aqueous solution but becomes soluble in an alkali aqueous solution by the action of an acid.

Examples of the multifunctional epoxy compounds include a compound of the following formula (13-1)

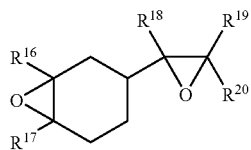

(13-1)

wherein $R^{16}$, $R^{17}$, $R^{18}$, $R^{19}$ and $R^{20}$ each independently represents hydrogen atom, methyl or ethyl;

a compound of the following formula (13-2)

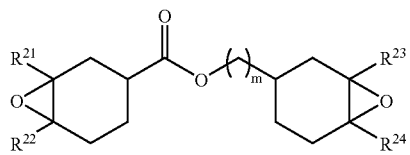

(13-2)

wherein $R^{21}$, $R^{22}$, $R^{23}$ and $R^{24}$ each independently represents hydrogen atom, methyl or ethyl; and m represents an integer of 1 to 8;

a compound of the following formula (13-3)

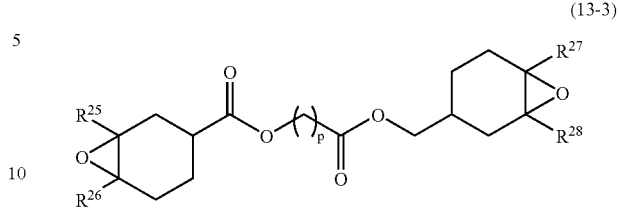

(13-3)

wherein $R^{25}$, $R^{26}$, $R^{27}$ and $R^{28}$ each independently represents hydrogen atom, methyl or ethyl; and p represents an integer of 1 to 8; and the like.

Specific examples of the multifunctional epoxy compounds represented by the formulae (13-1), (13-2) or (13-3) include following formulae:

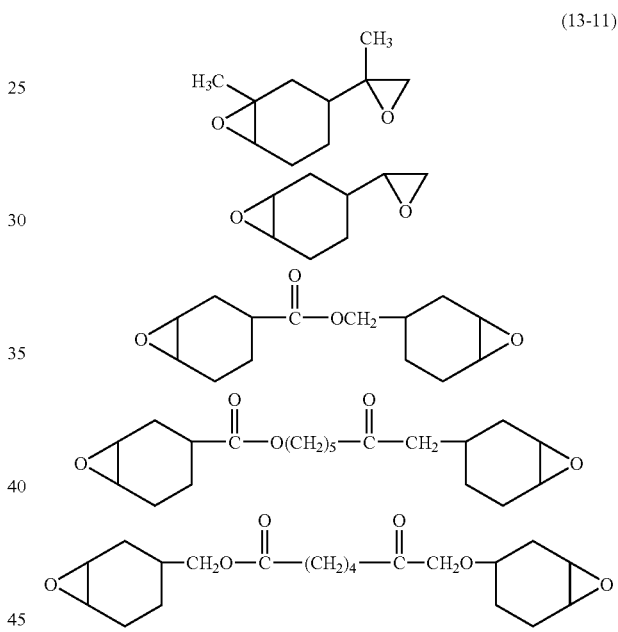

(13-11)

Specific examples of other multifunctional epoxy compounds to be used include the following formulae:

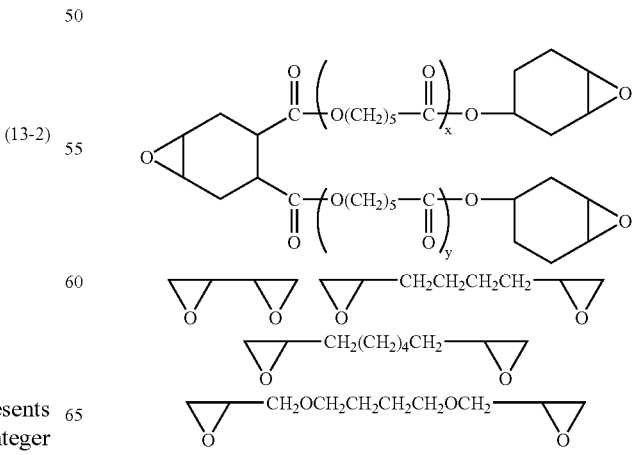

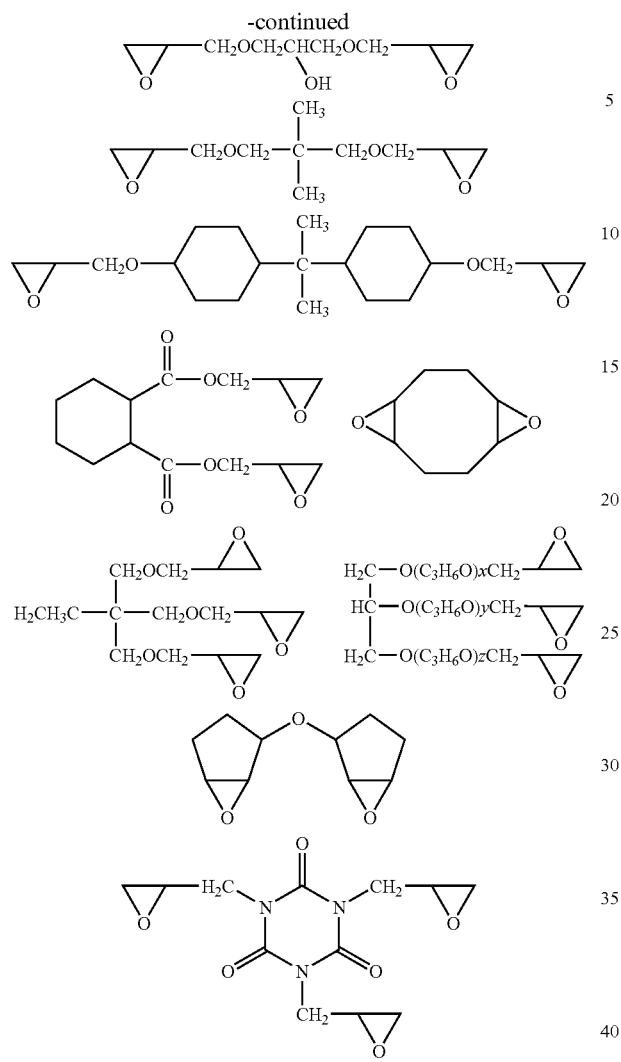

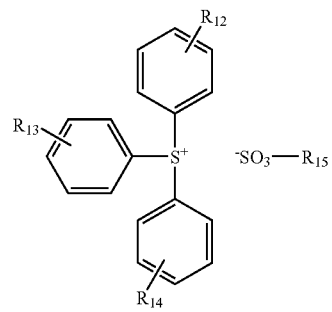

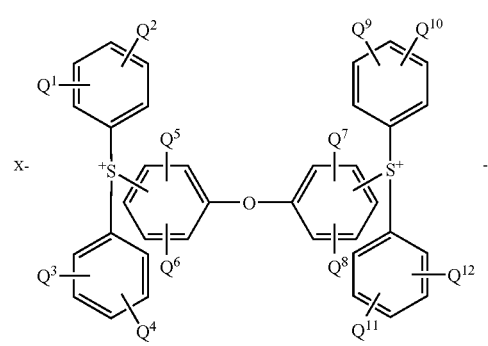

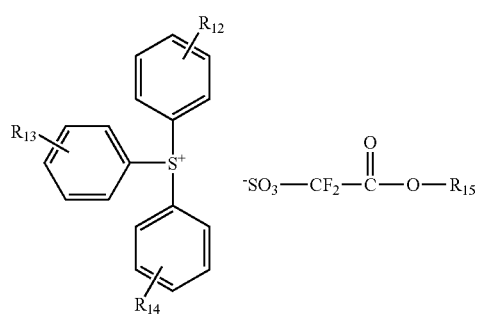

wherein x, y and z each independently represents an integer of 1 or 2.

As deterioration in sensitivity and resolution of the present resist composition obtained can be prevented, it is the most preferable to use the epoxy compound of the formula (13-1), especially the compound of the formula (13-11) among the aforementioned multifunctional epoxy compounds.

The acid generator used in the present invention is not particularly restricted providing the acid generator decomposes to generate an acid by allowing radiation such as light, electron beam and the like to act on the acid generator itself or a resist composition containing the acid generator.

An acid generated from the acid generator acts on the above-mentioned resin to dissociate a group dissociating by the action of an acid present in the resin.

As the acid generator, for example, onium salt compounds, organohalogen compounds, sulfone compounds, sulfonate compounds and the like are listed.

As the sulfonate compound, compounds of the general formulae (14), (15) and (16) are listed.

wherein $R_{12}$, $R_{13}$ and $R_{14}$ represent each independently a hydrogen atom, halogen atom, hydroxyl group, alkyl group having 1 to 14 carbon atoms or alkoxy group having 1 to 14 carbon atoms, wherein the alkyl group may have at least one substituent selected from the group consisting of halogen atoms, hydroxyl group, alicyclic hydrocarbon groups, lactone group and aromatic hydrocarbon groups, and the alicyclic hydrocarbon group, lactone group and aromatic hydrocarbon group may each independently have at least one substituent selected from the group consisting of halogen atoms, hydroxyl group and alkyl groups, the alkoxy group may have at least one substituent selected from the group consisting of halogen atoms, hydroxyl group, alicyclic hydrocarbon groups and aromatic hydrocarbon groups, the alicyclic hydrocarbon group and aromatic hydrocarbon group may each independently have at least one substituent selected from the group consisting of halogen atoms, hydroxyl group and alkyl groups; $R_{15}$ represents straight chained or branched alkyl group optionally substituted with a halogen atom or alicyclic alkyl group optionally substituted with a halogen atom; $Q^1$ to $Q^{12}$ each independently represents hydrogen atom, hydroxyl group, straight chained or branched alkyl group having 1 to 6 carbon atoms or straight chained or branched alkoxy group having 1 to 6 carbon atoms.

The compounds in which $R_{15}$ is a trifluoromethyl group are preferable from the standpoint of resolution.

Specific examples of the acid generators include the following compounds.

Diphenyliodonium trifluoromethanesulfonate,
4-methoxyphenylphenyliodinium hexafluoroantimonate,
4-methoxyphenylphenyliodinium trifluoromethanesulfonate,
bis(4-tert-butylphenyl)iodonium tetrafluoroborate
bis(4-tert-butylphenyl)iodonium perfluorobutanesulfonate,
bis(4-tert-butylphenyl)iodonium hexafluorophosphate,
bis(4-tert-butylphenyl)iodonium hexafluoroantimonate,
bis(4-tert-butylphenyl)iodonium trifluoromethanesulfonate,
bis(4-tert-butylphenyl)iodonium camphorsulfonate,
triphenylsulfonium hexafluorophosphate,
triphenylsulfonium hexafluoroantimonate,
triphenylsulfonium trifluoromethanesulfonate,
triphenylsulfonium perfluorobutanesulfonate,
triphenylsulfonium perfluorooctanesulfonate,
tri(4-methylphenyl)sulfonium trifluoromethanesulfonate,
tri(4-methylphenyl)sulfonium perfluorobutanesulfonate,
tri(4-methylphenyl)sulfonium perfluorooctanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
p-tolyldiphenylsulfonium perfluorobutanesulfonate,
p-tolyldiphenylsulfonium perfluorooctanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphtholylmethyl)thiolanium hexafluoroantimonate,
1-(2-naphtholylmethyl)thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
cyclohexylmethyl(2-oxocyclohexyl)sulfonium trifluoromethanesulfonate,
cyclohexylmethyl(2-oxocyclohexyl)sulfonium perfluorobutanesulfonate,
cyclohexylmethyl(2-oxycyclohexyl)sulfonium perfluorootcanesulfonate,
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolan-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine,
diphenyl disulfone,
di-p-tolyl disulfone,
bis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
1-benzoyl-1-phenylmethyl p-toluenesulfonate (generally called "benzoin tosylate"),
2-benzoyl-2-hydroxy-2-phenylethyl p-toluenesulfonate (generally called α-methylolbenzoin tosylate),
1,2,3-benzene-tri-yl tris(methanesulfonate),
2,6-dinitrobenzyl p-toluenesulfonate,
2-nitrobenzyl p-toluenesulfonate,
4-nitrobenzyl p-toluenesulfonate,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide,
N-(10-camphorsulfonyloxy)naphthalimide and the like.
(oxydi-4,1-phenylene)bisdiphenylsulfonium bis(methanesulfonate),
(oxydi-4,1-phenylene)bisdiphenylsulfonium bis(benzenesulfonate),
(oxydi-4,1-phenylene)bisdiphenylsulfonium bis(p-toluenesulfonate),
(oxydi-4,1-phenylene)bisdiphenylsulfonium bis(camphorsulfonate),
(oxydi-4,1-phenylene)bisdiphenylsulfonium bis(triisopropyobenzenesulfonate),
(oxydi-4,1-phenylene)bisdiphenylsulfonium bis(pentafluorobenzenesulfonate),
(oxydi-4,1-phenylene)bisdiphenylsulfonium bis(trifluoromethanesulfonate),
(oxydi-4,1-phenylene)bisdiphenylsulfonium bis(perfluorobutanesulfonate),
(oxydi-4,1-phenylene)bisdiphenylsulfonium bis(perfluorooctanesulfonate),
(oxydi-4,1-phenylene)bisdiphenylsulfonium bis{trifluoro-N-[(perfluoromethyl)sulfonyl]-1-methanesulfonamidate},
(oxydi-4,1-phenylene)bisdiphenylsulfonium bis{perfluoro-N-[(perfluoroethyl)sulfonyl]-1-ethanesulfonamidate},
(oxydi-4,1-phenylene)bisdiphenylsulfonium bis{perfluoro-N-[(perfluorobutyl)sulfonyl]-1-butanesulfonamidate},
(oxydi-4,1-phenylene)bisdiphenylsulfonium bis{trifluoro-N-[(perfluorobutyl)sulfonyl]-1-methanesulfonamidate},
(oxydi-4,1-phenylene)bisdiphenylsulfonium bis(tetrafluoroborate),
(oxydi-4,1-phenylene)bisdiphenylsulfonium bis(hexafluoroarsenate),
(oxydi-4,1-phenylene)bisdiphenylsulfonium bis(hexafluoroantimonate),
(oxydi-4,1-phenylene)bisdiphenylsulfonium bis(hexafluorophosphate),
(oxydi-4,1-phenylene)bisdi(4-tert-butylphenyl)sulfonium bis(trifluoromethanesulfonate), (oxydi-4,1-phenylene)bisdi(4-tert-butylphenyl)sulfonium bis(perfluorobutanesulfonate),
(oxydi-4,1-phenylene)bisdi(p-tolyl)sulfonium bis(trifluoromethanesulfonate),
triphenylsulfonium (adamantan-1-ylmethyl)oxycarbonyldifluoromethanesulfonate, and the like.

The content of the acid generator is usually 0.1 to 20 parts by weight per 100 parts by weight of the resin which itself is insoluble or poorly soluble in an alkali aqueous solution but becomes soluble in an alkali aqueous solution by the action of an acid.

In addition, when the present resist composition is the one used for a positive resist composition, performance deterioration due to the deactivation of an acid associated with leaving after exposure can be reduced by adding basic compounds, particularly basic nitrogen-containing organic compounds such as an amine. Specific examples of such basic compounds include the ones represented by the following formulae:

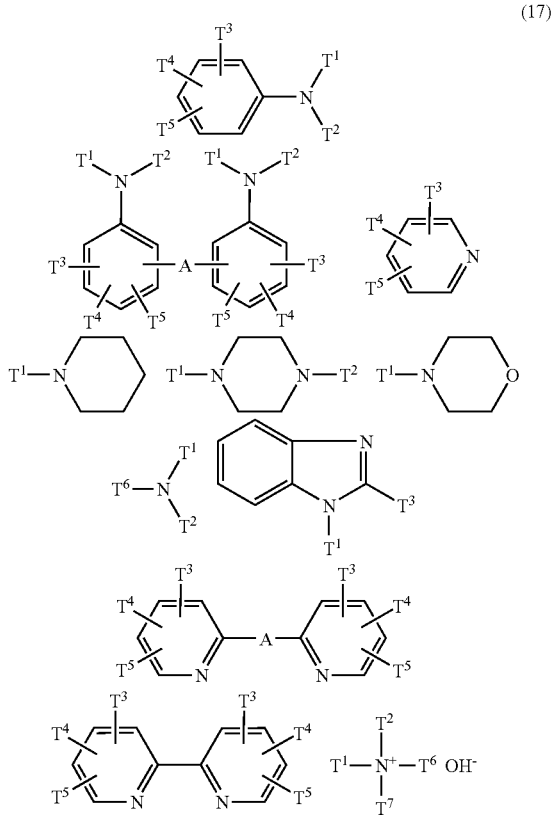

(17)

wherein $T^1$, $T^2$ and $T^7$ each independently represent hydrogen, alkyl, cycloalkyl or aryl. The alkyl preferably has about 1 to 6 carbon atoms, the cycloalkyl preferably has about 5 to 10 carbon atoms, and the aryl preferably has about 6 to 10 carbon atoms. Furthermore, at least one hydrogen on the alkyl, cycloalkyl or aryl may each independently be substituted with a hydroxyl group, an amino group, or an alkoxy group having 1 to 6 carbon atoms. At least one hydrogen on the amino group each independently may be substituted with an alkyl group having 1 to 4 carbon atoms.

$T^3$, $T^4$ and $T^5$ each independently represent hydrogen, alkyl, cycloalkyl, aryl or alkoxy. The alkyl preferably has about 1 to 6 carbon atoms, the cycloalkyl preferably has about 5 to 10 carbon atoms, the aryl preferably has about 6 to 10 carbon atoms, and the alkoxy preferably has about 1 to 6 carbon atoms. Furthermore, at least one hydrogen on the alkyl, cycloalkyl, aryl or alkoxy each independently may be substituted with a hydroxyl group, an amino group, or an alkoxy group having 1 to 6 carbon atoms. At least one hydrogen on the amino group may be substituted with an alkyl group having 1 to 4 carbon atoms.

$T^6$ represents alkyl or cycloalkyl. The alkyl preferably has about 1 to 6 carbon atoms, and the cycloalkyl preferably has about 5 to 10 carbon atoms. Furthermore, at least one hydrogen on the alkyl or cycloalkyl may each independently be substituted with a hydroxyl group, an amino group, or an alkoxy group having 1 to 6 carbon atoms. At least one hydrogen on the amino group may be substituted with an alkyl group having 1 to 4 carbon atoms.

However, none of $T^1$, $T^2$ and $T^7$ in the compound represented by the above formula (17) is hydrogen.

A represents alkylene, carbonyl, imino, sulfide or disulfide. The alkylene preferably has about 2 to 6 carbon atoms.

Moreover, among $T^1$-$T^7$, in regard to those which can be straight-chained or branched, either of these may be permitted.

Examples of such compounds include hexylamine, heptylamine, octylamine, nonylamine, decylamine, aniline, 2-, 3- or 4-methylaniline, 4-nitroaniline, 1- or 2-naphthylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylanine, didecylamine, N-methylaniline, piperidine, diphenylamine, triethylamine, trimethylamine, tripropylamine, tributylamine, tripentylamine, trihexylamine, trihexylamine, triheptylaamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, N,N-dimethylaniline, 2,6-isopropylaniline, imidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis (2-pyridyl)ethylene, 1,2-bis(4-pyridyl)ethylene, 1,2-bis(2-pyridyloxy)ethane, 4,4'-dipyridyl sulfide, 4,4'-dipyridyl disulfide, 1,2-bis(4-pyridyl)ethylene, 2,2'-dipicolylarnine, 3,3'-dipicolylamine, tetramethylammonium hydroxide, tetraisopropylammonium hydroxide, tetrabutylammonium hydroxide, tetra-n-hexylammonium hydroxide, tetra-n-octylammonium hydroxide, phenyltrimethylammonium hydroxide, 3-trifluoromethylphenyltrimethylammonium hydroxide, (2-hydroxyethyl)trimethylammonium hydroxide (so-called "cholline"), and the like.

Furthermore, hindered amine compounds having piperidine skeleton as disclosed in JP-A-H11-52575 can be used as quencher.

For improvement of resolution, it is preferable to use the compounds represented by the formula (14) as quencher. Specific preferred examples include tetramethylammonium hydroxide, tetrabutylammonium hydroxide, tetrahexyl ammonium hydroxide, tetraoctyl ammonium hydroxide, phenyltrimethylammonium hydroxide and 3-trifluoromethylphenyltrimethylammonium hydroxide.

When a basic compound is used in the present resist composition, it is preferred that the composition preferably contains the basic compound in the range of 0.001 to 1 part by weight per 100 parts by weight of the resin which itself is insoluble or poorly soluble in an alkali aqueous solution but becomes soluble in an alkali aqueous solution by the action of an acid.

The present resist composition may also contain various additives such as sensitizers, dissolution inhibitors, resins other than the above resin, surfactants, stabilizers, and dyes as long as the effect of the present invention is not obstructed.

The present resist composition generally becomes a liquid resist composition under the circumstances in which each of the above-described components is dissolved in a solvent. The liquid resist composition is applied on a substrate such as a silicon wafer according to a usual procedure such as spin coating.

Any solvent may be used as long as they dissolve each component, show suitable drying speed, and give a uniform and smooth film after evaporation of the solvent. Solvents generally used in this field can be used as the solvent.

Examples thereof include glycol ether esters such as ethylcellosolve acetate, methylcellosolve acetate, propylene glycol monomethyl ether acetate and the like;ethers such as diethyleneglycol dimethyl ether and the like; esters such as ethyl lactate, butyl acetate, amyl acetate, ethyl pyruvate and the like; ketones such as acetone, methyl isobutyl ketone, 2-heptanone, cylohexanone and the like; and cyclic esters such as γ-butyrolactone and the like. These solvents can be used each alone or in combination of two or more.

The resist film applied on a substrate, and dried is subjected to an exposure treatment for patterning. Then, after a heat-treatment for promoting a deprotecting reaction, development by an alkali developer is conducted. The alkali developer used herein can be various kinds of aqueous alkaline solutions used in this art. In general, an aqueous solution of tetramethylammonium hydroxide or (2-hydroxyethyl)trimethylammonium hydroxide (generally referred to as colline) is often used.

It should be construed that embodiments disclosed here are examples in all aspects and not restrictive. It is intended that the scope of the present invention is determined not by the above descriptions but by appended Claims, and includes all variations of the equivalent meanings and ranges to the Claims.

The following examples will illustrate the present invention further specifically, but do not limit the scope of the invention at all. Parts in the examples are by weight unless otherwise stated. The weight-average molecular weight and degree of dispersion were omeasured by gel permeation chromatography using polystyrene as a standard.

Synthesis Example of Resin

Partial EOM of Resin A-1 Obtained from Asahi Glass Co, Ltd. (Protection Ratio 26%)

2.5 g of A-1 of the following formula (weight-average molecular weight: about 49000) was added to 25 g of N,N-dimethylformamide in a flask and dissolved, and then 0.82 g of diisopropylethylamine was added to the solution. Thereafter, 0.50 g of ethoxymethyl chloride was dropped therein, and mixture was reacted at room temperature for 6 hours, then, 0.51 g of diisopropylethylamine was further added, 0.31 g of ethoxymethyl chloride was dropped into the mixture, and mixture was reacted at room temperature for 22 hours. After the reaction, suitable amount of methyl isobutyl ketone was added therein, and washing with ion-exchanged water was repeated. The organic layer was concentrated, then, diluted with suitable amount of acetone, and dropped into mixed solution of 100 g of water and 150 g of methanol, to precipitate resin. After filtration, the solid was dried in vacuo to obtain 2.26 g of resin. The weight-average molecular weight was about 52000, and the ethoxymethylation ratio was about 26% according to a nuclear magnetic resonance ($^1$H-NMR) spectrometer This resin is called Resin AX.

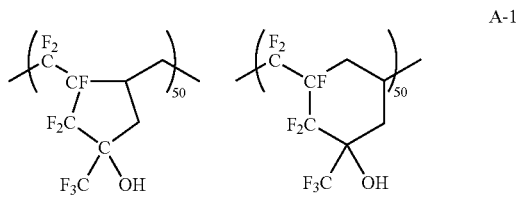

A-1

EXAMPLE 1 AND COMPARATIVE EXAMPLE 1

10 parts by weight of Resin AX was dissolved, in combination with 0.2 part by weight of p-tolyldiphenylsulfonium perfluorooctanesulfonate, 0.015 part of tetrabutylammonium hydroxide and a multifunctional epoxy compound of the following formula (13-11), in 60 parts by weight of propylene glycol monomethyl ether acetate/γ-butyrolactone (=95/5), further, filtrated through a fluorine resin filter having a pore diameter of 0.2 μm, to prepare a resist (Example 1).

Procedures for preparation of a resist were repeated as the above except the multifunctional epoxy compound was not added and a resist (Comparative Example 1) was obtained.

Multifunctional Epoxy Compound:

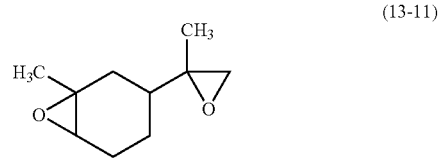

(13-11)

Properties of Sensitivity and Resolution

The resist solution prepared above was spin-coated on a silicon wafer carrying thereon an organic reflection prevention membrane having a thickness of 1600 Å formed by applying "DUV-30J-14" which is organic reflection prevention membrane composition manufactured by Brewer, and baking it under conditions of 215° C. and 60 seconds, so that the membrane thickness after drying was 0.19 μm. After application of the resist solution, prebaking on a direct hot plate for 60 seconds was conducted under conditions of 110° C. and 60 seconds in Example 1 and under conditions of 90° C. and 60 seconds in Comparative Example 1. The wafer on which a resist membrane had thus been formed was exposed to a liner and space pattern using ArF excimer stepper ["NSR ArF" manufactured by Nikon Corp., NA=0.55, σ=0.6] while gradually changing the exposure amount.

After exposure, post exposure baking on a hot plate for 60 seconds was conducted under conditions of 110° C. and 60 seconds, further, paddle development for 60 seconds was conducted with a 2.38 wt % tetramethylammonium hydroxide aqueous solution.

The line and space pattern after development on the organic reflection prevention membrane substrate was observed by a scanning electron microscope, methods, and the results are shown in Table 1.

Effective sensitivity: It is represented by exposure amount at which a 0.18 μm liner and space pattern of 1:1 is obtained.

Resolution: It is represented by the minimum dimension of a line and space pattern separating by exposure amount at the effective sensitivity.

Measurement of Durability against Dry Etching: The resist solution prepared above was spin-coated on the silicon wafer treated with hexamethylsilazane so that the film thickness after drying was between 0.3 and 0.5 μm. After application of the resist solution, prebake was conducted at 110° C. for 60 seconds on a direct hot plate. The wafer on which the resist film had thus been formed was etched for 4 minutes using DEM-451 (manufactured by ANERVA Co., Ltd.) under the conditions in which the flow rate of the mixed gas was 2.5 sccm of oxygen and 50 sccm of $CHF_3$, the pressure was 16 Pa and INCIDENSE POWER was 250 W. The difference of thickness of the film between before and after etching was shown as the ratio to the difference of novolac resin. Smaller value of said ratio indicates higher durability against dry etching. The thickness of the film was measured by RAMDA ACE.

Ratio of Transmittance: A solution prepared by dissolving only the resist solution prepared above and a resin in a propylene glycol monomethyl ether acetate was applied on a magnesium fluoride wafer, so that the membrane thickness after drying was 0.1 μm, and prebaked on a direct hot plate under conditions of 110° C. and 60 seconds, to form a resist membrane. The transmittance of thus formed resist membrane at a wavelength of 157 nm was measured using a vacuum ultraviolet spectrometer (VUV-200, manufactured by Nippon Bunko K.K.). The results obtained are shown in Table 1.

TABLE 1

| Example No. | MFEC (part) | ESENS (mJ/cm$^2$) | RESO (μm) | RODADE | ROTRANS(%) 157 nm TOF/1000 Å |
|---|---|---|---|---|---|
| Example 1 | 0.1 | 18 | 0.18 | 1.74 | 86.7 |
| Comparative example 1 | 0 | 15 | 0.18 | 2.24 | 88.2 |

MFEC: Multifunctional Epoxy Compound
ESENS: Effective Sensitivity
RESO: Resolution
RODADE: Ratio of Durability aganist Dry Etching relative to resist for I ray
ROTRANS: Ratio of Transmittance
TOF: Thickness of Film As apparent from Table 1, the resist of Example 1 shows high durability against dry etching and excellent in balance of resolution and sensitivity. Further, the resist of Example 1 can be applied for $F_2$ excimer laser because the transmittance at a wavelength of 157 nm does not decreases.

The chemical amplification type positive resist composition of the present invention shows high durability against dry etching and excellent in balance of abilities such as resolution and sensitivity. Therefore, this composition can manifest excellent abilities as resist for KrF excimer laser, ArF eximer laser and $F_2$ excimer laser.

What is claimed is:

1. A positive resist composition comprising a resin which itself is insoluble or poorly soluble in an alkali aqueous solution but becomes soluble in an alkali aqueous solution by the action of an acid, an acid generator, and a multifunctional epoxy compound, wherein the content of halogen atoms in the resin is 40% by weight or more;

at least one of structural units constituting the resin is a structural unit having an alicyclic hydrocarbon skeleton of the formula (2')

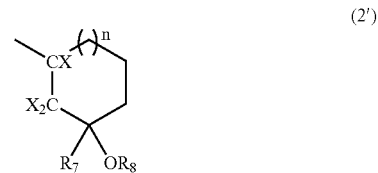

(2')

wherein X represents a halogen atom; $R_7$ represents an alkyl group having 1 to 6 carbon atoms substituted with at least one halogen atom or alicyclic hydrocarbon group substituted with at least one halogen atom; and $R_8$ represents a hydrogen or an acid-unstable group dissociating in the presence of an acid, and n represents 0 or 1; and the structural unit having an alicyclic hydrocarbon skeleton contains therein at least one group rendering the resin soluble in an alkali aqueous solution by the action of an acid, and at least one halogen atom.

2. The positive resist composition according to claim 1, wherein the cyclic hydrocarbon skeleton of the formula (2') is an alicyclic hydrocarbon skeleton of the formula (4):

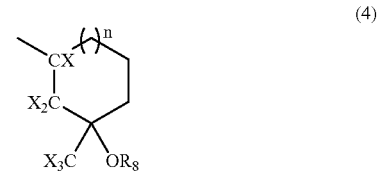

(4)

wherein X, $R_8$ and n have the same meanings as described above.

3. The positive resist composition according to claim 2 wherein $R_8$ is a group of the formula (5):

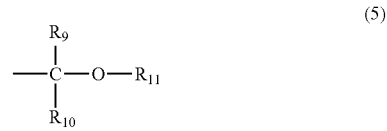

(5)

wherein $R_9$ and $R_{10}$ each independently represent an alkyl group having 1 to 14 carbon atoms or a hydrogen atom, the alkyl group may have at least one group selected from the group consisting of halogen atoms and alicyclic hydrocarbon groups; $R_{11}$ represents an alkyl group having 1 to 14 carbon atoms, alicyclic hydrocarbon group, lactone ring group or aromatic hydrocarbon group, the alkyl group may have at least one substituent selected from the group consisting of halogen atom, alicyclic hydrocarbon group and aromatic hydrocarbon group, the alicyclic hydrocarbon group, lactone ring group and aromatic hydrocarbon group in $R_{11}$ may each independently have at least one substituent selected from the group consisting of halogen atoms and alkyl groups.

4. The positive resist composition according to claim 3 wherein in the formula (5), $R_9$ and $R_{10}$ represent a hydrogen atom, and $R_{11}$ represents an ethyl group.

5. The positive resist composition according to claim 1 wherein the halogen atom is a fluorine atom.

6. The positive resist composition according to claim 1 wherein the structural unit having an alicyclic hydrocarbon skeleton is a structural unit of the formula (7):

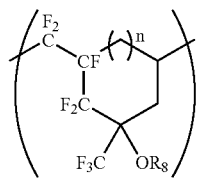

(7)

wherein n and $R_8$ have the same meanings as described above.

7. The positive resist composition according to claim 1 wherein the resin is a copolymer containing a structural unit of the following formula (8) and a structural unit of the following formula (8-1):

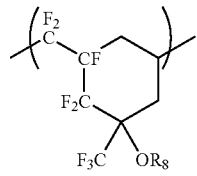

(8)

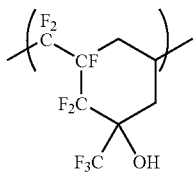

(8-1)

wherein $R_8$ has the same meaning as described above.

8. The positive resist composition according to claim 1 wherein the resin is a copolymer containing a structural unit of the following formula (9) and a structural unit of the following formula (9-1):

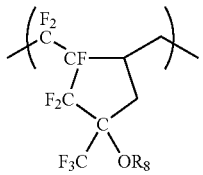

(9)

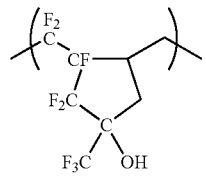

(9-1)

wherein, $R_8$ has the same meaning as described above.

9. The positive resist composition according to claim 1 wherein the multifunctional epoxy compound is a compound of the following formula (13-1):

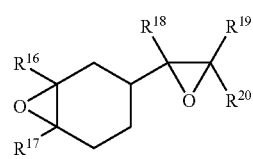

(13-1)

wherein $R^{16}$, $R^{17}$, $R^{18}$, $R^{19}$ and $R^{20}$ each independently represents hydrogen atom, methyl or ethyl.

10. The positive resist composition according to claim 1 wherein the multifunctional epoxy compound is a compound of the following formula (13-2):

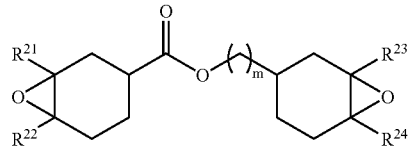

(13-2)

wherein $R^{21}$, $R^{22}$, $R^{23}$ and $R^{24}$ each independently represents hydrogen atom, methyl or ethyl; and m represents an integer of 1 to 8.

11. The positive resist composition according to claim 1 wherein the multifunctional epoxy compound is a compound of the following formula (13-3):

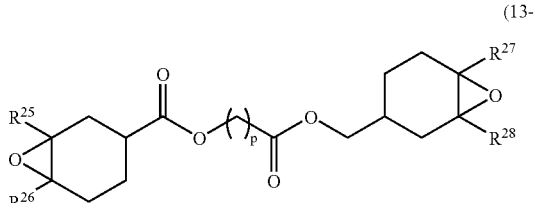

(13-3)

wherein $R^{25}$, $R^{26}$, $R^{27}$ and $R^{28}$ each independently represents hydrogen atom, methyl or ethyl; and p represents an integer of 1 to 8.

12. The positive resist composition according to claim 1 wherein the multifunctional epoxy compound is a compound of the following formula (13-11):

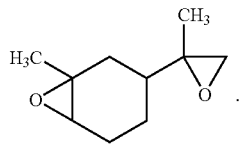

(13-11)

13. The positive resist composition according to claim 1 wherein the content of the structural unit having an alicyclic hydrocarbon skeleton and containing therein at least one group rendering the resin soluble in an alkali aqueous solution by the action of an acid, and at least one halogen atom is 15 to 50 mol % in the resin.

14. The positive resist composition according to claim 1 wherein the composition comprises an acid generator of the general formula (14):

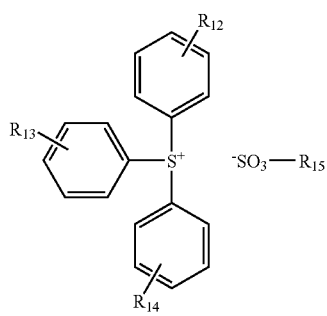

(14)

wherein $R_{12}$, $R_{13}$ and $R_{14}$ represent each independently a hydrogen atom, halogen atom, hydroxyl group, alkyl group having 1 to 14 carbon atoms or alkoxy group having 1 to 14 carbon atoms, wherein the alkyl group may have at least one substituent selected from the group consisting of halogen atoms, hydroxyl group, alicyclic hydrocarbon groups, lactone group and aromatic hydrocarbon groups, and the alicyclic hydrocarbon group, lactone group and aromatic hydrocarbon group may each independently have at least one substituent selected from the group consisting of halogen atoms, hydroxyl group and alkyl groups, the alkoxy group may have at least one substituent selected from the group consisting of halogen atoms, hydroxyl group, alicyclic hydrocarbon groups and aromatic hydrocarbon groups, the alicyclic hydrocarbon group and aromatic hydrocarbon group may each independently have at least one substituent selected from the group consisting of halogen atoms, hydroxyl group and alkyl groups; and $R_{15}$ represents straight chained or branched alkyl group optionally substituted with a halogen atom or alicyclic alkyl group optionally substituted with a halogen atom.

15. The positive resist composition according to claim 1 wherein the composition further comprises an acid generator of the general formula (15):

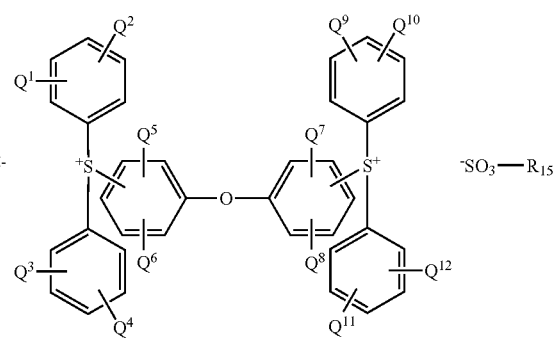

(15)

wherein $Q_1$ to $Q_{12}$ each independently represents hydrogen atom, hydroxyl group, straight chained or branched alkyl group having 1 to 6 carbon atoms or straight chained or branched alkoxy group having 1 to 6 carbon atoms; and $R_{15}$ has the same meaning as described above.

16. The positive resist composition according to claim 1 wherein the composition further comprises an acid generator of the general formula (16):

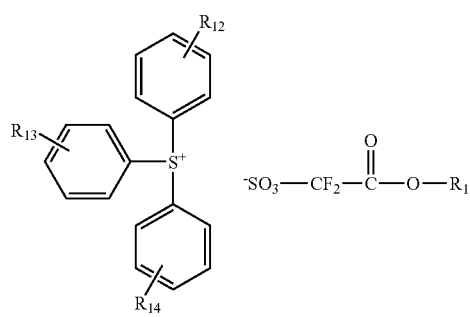

(16)

wherein $R_{12}$, $R_{13}$, $R_{14}$ and $R_{15}$ have the same meanings as defined above.

17. The positive resist composition according to claim 14 wherein $R_{15}$ is a methyl group.

18. The positive resist composition according to claim 14 wherein $R_{15}$ is a trifluoromethyl group.

19. The positive resist composition according to claim 1 wherein the content of the acid generator is 0.1 to 20 parts by weight, and the content of the multifunctional epoxy compound is 0.01 to 5 parts by weight per 100 parts by weight of the resin which itself is insoluble or poorly soluble in an alkali aqueous solution but becomes soluble in an alkali aqueous solution by the action of an acid.

20. The positive resist composition according to claim 1 wherein the composition further comprises a basic compound.

21. The positive resist composition according to claim 20 wherein the content of the basic compound is 0.001 to 1 part by weight per 100 parts by weight of the resin which itself is insoluble or poorly soluble in an alkali aqueous solution but becomes soluble in an alkali aqueous solution by the action of an acid.

22. The positive resist composition according to claim 20, wherein the basic compound is a compound of the following formula (17):

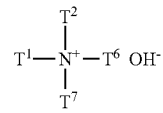
(17)

wherein $T^1$, $T^2$ and $T^7$ each independently represent alkyl, cycloalkyl or aryl, wherein at least one hydrogen on the alkyl, cycloalkyl or aryl each independently is optionally substituted with a hydroxyl group, an amino group, or an alkoxy group having 1 to 6 carbon atoms, and at least one hydrogen on the amino group each independently is optionally substituted with an alkyl group having 1 to 4 carbon atoms; $T^6$ represents alkyl or cycloalkyl, at least one hydrogen on the alkyl or cycloalkyl each independently is optionally substituted with a hydroxyl group, an amino group, or an alkoxy group having 1 to 6 carbon atoms, and at least one hydrogen on the amino group is optionally substituted with an alkyl group having 1 to 4 carbon atoms.

23. The positive resist composition according to claim 1, wherein the resin is a partially ethoxymethylated copolymer comprising the formulae:

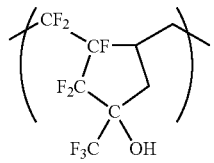 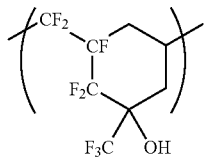

24. The positive resist composition according to claim 1, wherein the resin is a product obtained by partial ethoxymethylation of a copolymer comprising the formulae:

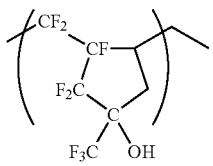 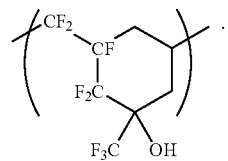

25. The positive resist composition according to claim 1, wherein the resin is a partially ethoxymethylated copolymer consisting of the formulae:

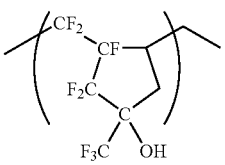 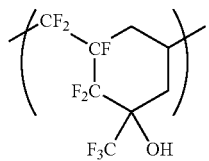

26. The positive resist composition according to claim 1, wherein the resin is a product obtained by partial ethoxymethylation of a copolymer consisting of the formulae:

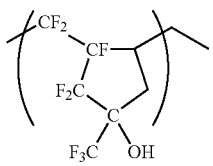 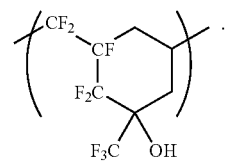

* * * * *